United States Patent
Yu

(10) Patent No.: US 7,336,492 B2
(45) Date of Patent: Feb. 26, 2008

(54) HEAT DISSIPATING APPARATUS

(75) Inventor: Fang-Xiang Yu, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 57 days.

(21) Appl. No.: 11/308,272

(22) Filed: Mar. 15, 2006

(65) Prior Publication Data

US 2007/0041161 A1    Feb. 22, 2007

(30) Foreign Application Priority Data

Aug. 18, 2005  (CN) .................. 2005 2 0063496 U

(51) Int. Cl.
*H05K 7/20* (2006.01)

(52) U.S. Cl. ............... 361/710; 361/704; 361/709; 361/700; 165/80.2; 165/80.3; 165/104.33

(58) Field of Classification Search ......... 361/687, 361/690, 702–712, 714–719, 724, 727; 257/706–727; 165/80.2, 80.3, 80.4, 185, 121–127; 174/16.3, 174/252; 411/511, 516, 530; 24/482, 485, 24/539, 531, 545–547, 555, 568, 625, 630, 24/981; 248/316.5, 505, 506, 510; 439/73, 439/485, 487

See application file for complete search history.

(56) References Cited

U.S. PATENT DOCUMENTS

| | | | | |
|---|---|---|---|---|
| 5,428,897 A | * | 7/1995 | Jordan et al. | 29/890.03 |
| 6,286,586 B2 | * | 9/2001 | Cook | 165/80.3 |
| 6,295,203 B1 | * | 9/2001 | Lo | 361/704 |
| 6,415,853 B1 | | 7/2002 | Tao et al. | |
| 6,644,387 B1 | * | 11/2003 | Lee et al. | 165/80.3 |
| 6,813,155 B2 | * | 11/2004 | Lo | 361/709 |

FOREIGN PATENT DOCUMENTS

TW    M272143    8/2005

* cited by examiner

*Primary Examiner*—Michael Datskovskiy
(74) *Attorney, Agent, or Firm*—Winston Hsu

(57) ABSTRACT

A heat dissipating apparatus (10) for dissipating heat from a heat-generating electronic component includes a heat sink (14), a resilient clipping member (162), and an operating member (164). The heat sink contacts with the heat-generating electronic component, and includes a fin assembly (144) which defines a channel (146) therein. The resilient clipping member is received in the channel of the heat sink for mounting the heat sink on the heat-generating electronic component. The operating member is pivotally mounted to the clipping member. At least one portion of the operating member is mounted between the fin assembly and the clipping member. The at least one portion can move from an unlock position to a lock position to support the clipping member away from the heat-generating electronic component.

15 Claims, 6 Drawing Sheets

HEAT DISSIPATING APPARATUS

CROSS-REFERENCES TO RELATED APPLICATION

This application is related to the co-pending U.S. patent application filed on Aug. 25, 2005 with the same assignee as the instant application, and entitled "HEAT DISSIPATING APPARATUS". The disclosure of the above-identified applications is incorporated herein by reference.

FIELD OF THE INVENTION

The present invention relates generally to a heat dissipating apparatus, and more particularly to a heat dissipating apparatus for dissipating heat generated by electronic components.

DESCRIPTION OF RELATED ART

Conventionally, a heat dissipating apparatus for a heat generating electronic component includes a heat sink, a retention module disposed around the electronic component, and a clip for mounting the heat sink to the retention module to make the heat sink contact with the electronic component.

The heat sink includes a base, and two groups of fins mounted on the base. A channel is formed at a middle portion of the heat sink between the two groups of fins, for receiving the clip therein. The clip includes a resilient abutting portion, and two clutches extending downwardly from two opposite ends of the abutting portion for catching with the retention module. The abutting portion is bent downwardly at a middle section thereof to form a pressing surface thereat.

In assembly of the heat dissipating apparatus, the heat sink and the clip are orderly mounted to the retention module with the clip being received in the channel of the heat sink. One clutch of the clip is caught to one side of the retention module, with the pressing surface of the abutting portion of the clip loosely contacting with a top surface of the base of the heat sink. The other clutch is pressed toward an opposite side of the retention module until the other clutch is caught to the opposite side of the retention module, with the abutting portion of the clip deformed downwardly, thereby generating a resilient force exerted on the base of the heat sink. The resilient force of the clip presses the heat sink to move downwardly, making a bottom surface of the base of the heat sink intimately contact with the electronic component. Thus, the heat sink is mounted to the electronic component.

In the heat dissipating apparatus, the heat sink includes two groups of fins which are separated from each other. The assembly of the two separate groups of the fins decreases the efficiency of the assembly of the heat sink. Furthermore, the groups of fins need to be positioned and then fixed to the base respectively in the assembly of the heat sink, which further decreases the efficiency of the assembly of the heat sink. The efficiency of the assembly of the heat dissipating apparatus is not good enough, which needs to be improved to thereby reduce the assembling time and cost of the heat dissipating apparatus.

SUMMARY OF INVENTION

The present invention relates to a heat dissipating apparatus for dissipating heat from a heat-generating electronic component. According to a preferred embodiment of the present invention, the heat dissipating apparatus for dissipating heat from a heat-generating electronic component includes a heat sink, a resilient clipping member, and an operating member. The heat sink contacts with the heat-generating electronic component, and includes a fin assembly which defines a channel therein. The resilient clipping member is received in the channel of the heat sink for mounting the heat sink on the heat-generating electronic component. The operating member is pivotally mounted to the clipping member. At least one portion of the operating member is mounted between the fin assembly and the clipping member. The at least one portion can move from an unlock position to a lock position to urge the clipping member away from the heat-generating electronic component, whereby the clipping member exerts a downwardly resilient force to the heat sink to make the heat sink have an intimate contact with the electronic component.

Other advantages and novel features of the present invention will become more apparent from the following detailed description of preferred embodiment when taken in conjunction with the accompanying drawings, in which:

DETAILED DESCRIPTION

Figure 1:
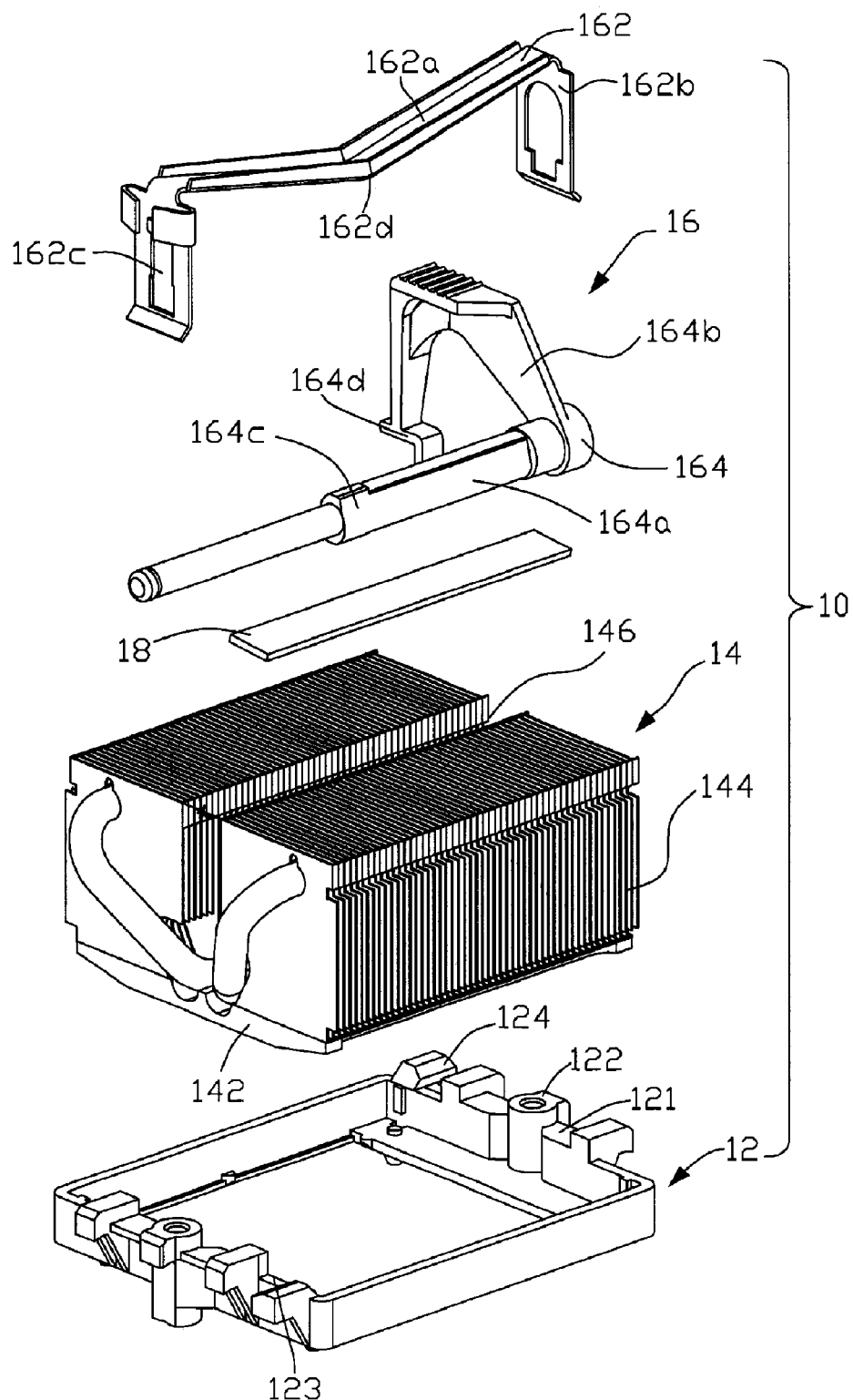
FIG. 1 is an exploded, isometric view of a heat dissipating apparatus according to a preferred embodiment of the present invention.

Referring to FIG. 1, a heat dissipating apparatus 10 for timely removing heat generated by a heat-generating electronic component (not shown) includes a rectangular shaped retention module 12, a heat sink 14, a clip 16, and a supporting plate 18.

The retention module 12 is mounted on a printed circuit board (not shown) for enclosing the heat-generating electronic component therein. The retention module 12 includes two clipping portions 122 at middles of two opposite sides 121, 123 thereof, respectively, and a blocking portion 124 at an end of the side 121. The clipping portions 122 perpendicularly extend outwardly along opposite directions from the two opposite sides 121,123 respectively. The blocking portion 124 extends outwardly from one of the sides 121 in a direction the same as the extension direction of the clipping portion 122 of the related side 121. The blocking portion 124 is located at an end of the related side 121.

Figure 2:
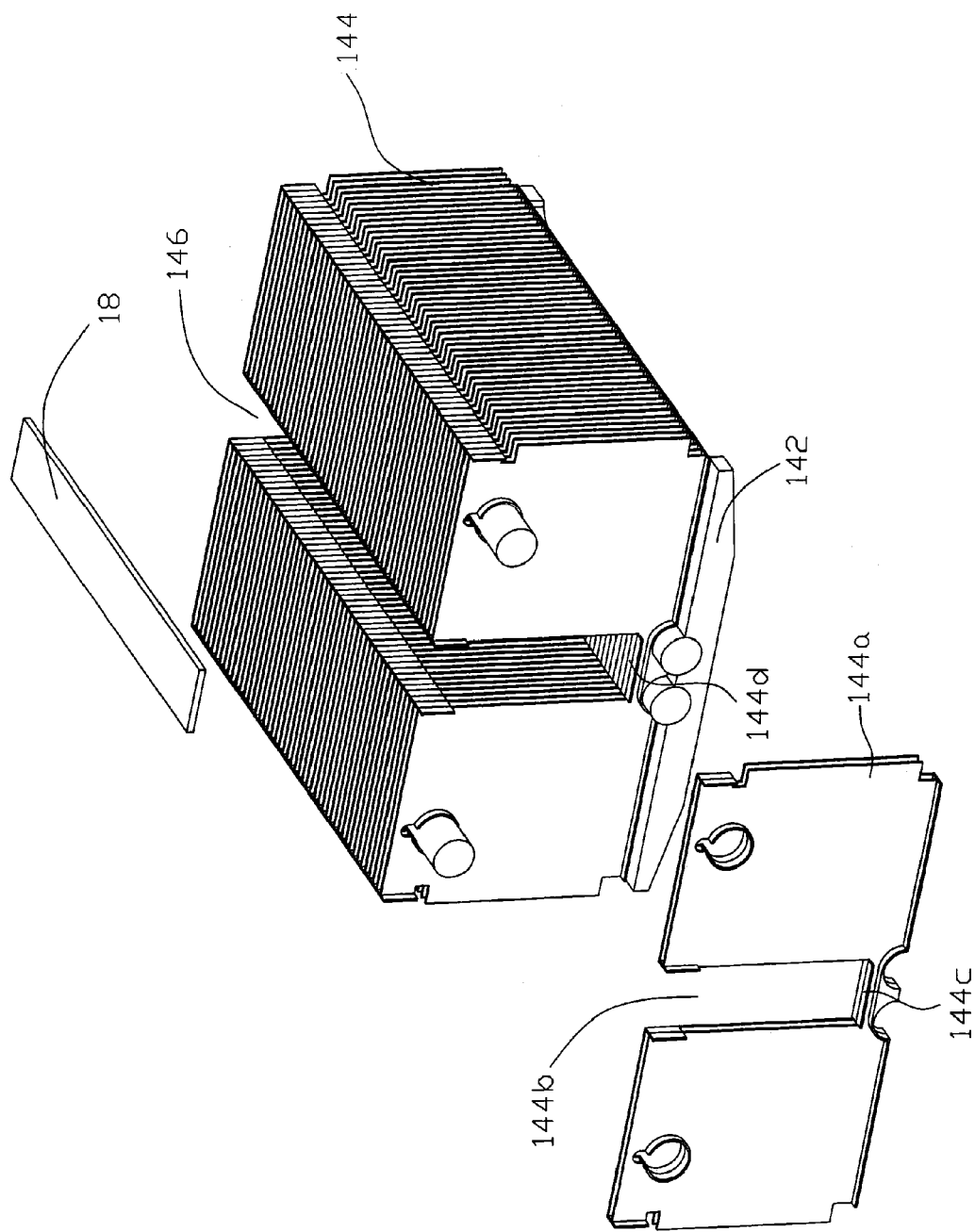
FIG. 2 is an exploded, isometric view of a heat sink and a supporting plate of the heat dissipating apparatus of FIG. 1.

Referring to FIG. 2, the heat sink 14 includes a base 142 for thermally contacting with the heat-generating component, and a fin assembly 144 mounted on the base 142. The fin assembly 144 includes a plurality of fins 144a parallel to each other. Each fin 144a of the fin assembly 144 includes a rectangular shaped cutout 144b, thereby defining a channel 146 at a middle portion of the fin assembly 144 of the heat sink 14 for receiving the clip 16 therein. The cutout 144b is defined in a middle of the fin 144a to divide the fin 144a into two similar halves (not labeled) interconnected with each other through a bridge (not labeled) of the fin 144a under the cutout 144b. The fin 144a extends a flange 144c toward an adjacent fin 144a at a bottom end of the cutout 144b. The flanges 144c contact with each other to form a supporting surface 144d at a bottom end of the channel 146 of the fin assembly 144.

Figure 4:
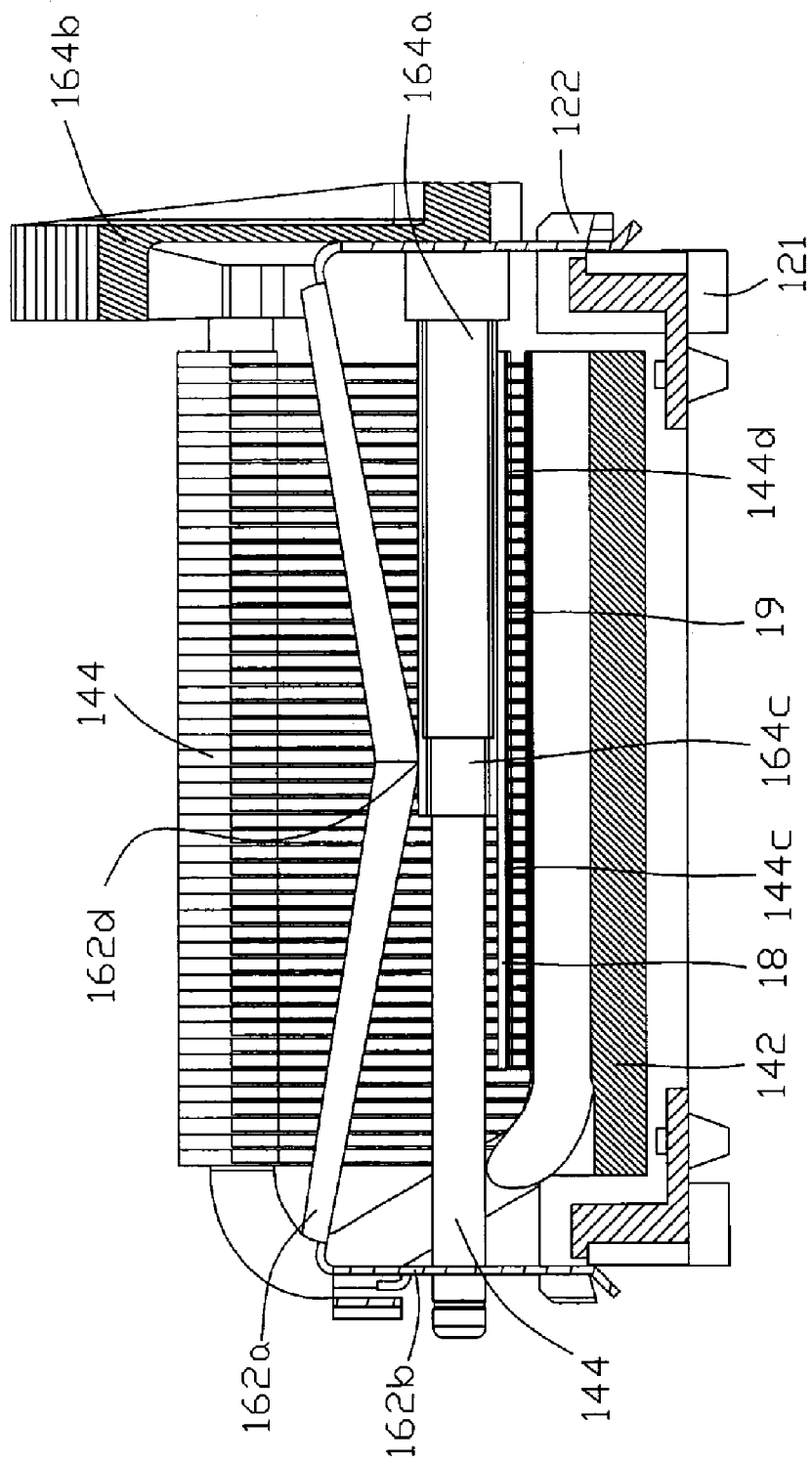
FIG. 4 is an elevational, cross-sectional view of FIG. 3.

Referring to FIG. 4, the supporting plate 18 is received in the channel 146 of the heat sink 14, sandwiched between the heat sink 14 and the clip 16. The supporting plate 18 is mounted on the supporting surface 144d of the heat sink 14 by soldering the supporting plate 18 to the supporting surface 144d. A solder paste 19, which can function as thermal interface material, is filled in spaces formed between a bottom surface of the supporting plate 18 and the supporting surface 144d of the heat sink 14 to reduce heat resistance therebetween. The solder paste 19 can further bond the supporting plate 18 onto the heat sink 14. The supporting surface 144d of the heat sink 14 is used for supporting the solder paste 19 to prevent the solder paste 19 from leakage from spaces formed between two adjacent fins 144a of the fin assembly 144.

Particularly referring to FIG. 1, the clip 16 is used for engaging the heat sink 14 to the retention module 12 to make a bottom surface of the base 142 of the heat sink 14 intimately contact with the heat-generating component. The clip 16 includes a clipping member 162, and an operating member 164 for cooperating with the clipping member 162 to conveniently lock/unlock the heat sink 14 to/from the retention module 12.

The clipping member 162 includes a resilient main body 162a, and two clasping plates 162b extending downwardly at two distal ends of the main body 162a. The clasping plates 162b define two clasping holes 162c therein, respectively. The main body 162a is bent downwardly at a middle portion thereof, to form a middle pressing surface 162d. Two sides of the main body 162a extend slantingly and upwardly from the pressing surface 162d of the main body 162a to connect with the clasping plates 162, respectively. In this embodiment, the clasping plates 162b are integrally formed with the main body 162a. Alternatively, the clasping plates 162b and the main body 162a may be formed separately and then combined together.

The operating member 164 includes a longitudinal pole 164a and an operating portion 164b perpendicularly extending from an end of the pole 164a. When the operating portion 164b is manipulated, the pole 164a rotates accordingly.

The pole 164a of the operating member 164 spans across the clasping plates 162b of the clipping member 162 with two ends of the pole 164a pivotably received in the clasping holes 162c of the clasping plates 162b. The pole 164a includes a supporting portion 164c at a middle portion thereof corresponding to the pressing surface 162d of the clipping member 162. The cross section of the supporting portion 164c is cam-shaped, or ellipse-shaped. This enables the supporting portion 164c of the operating member 164 to push the pressing surface 162d of the clipping member 162 upwardly a sufficient distance away from the supporting surface 144d of the heat sink 14 when the operating member 164 is rotated to a lock position, and release the pressing surface 162d downwardly to make the pressing surface 162d loosely contact with the supporting portion 164c when the operating member 164 is rotated to an unlock position. The operating portion 164b of the operating member 164 includes an L-shaped blocking end 164d at a free end thereof, for engaging with the blocking portion 124 of the retention module 12 when the operating member 164 of the clip 16 is rotated to the lock position to lock the heat sink 14 to the retention module 12.

Figure 3:
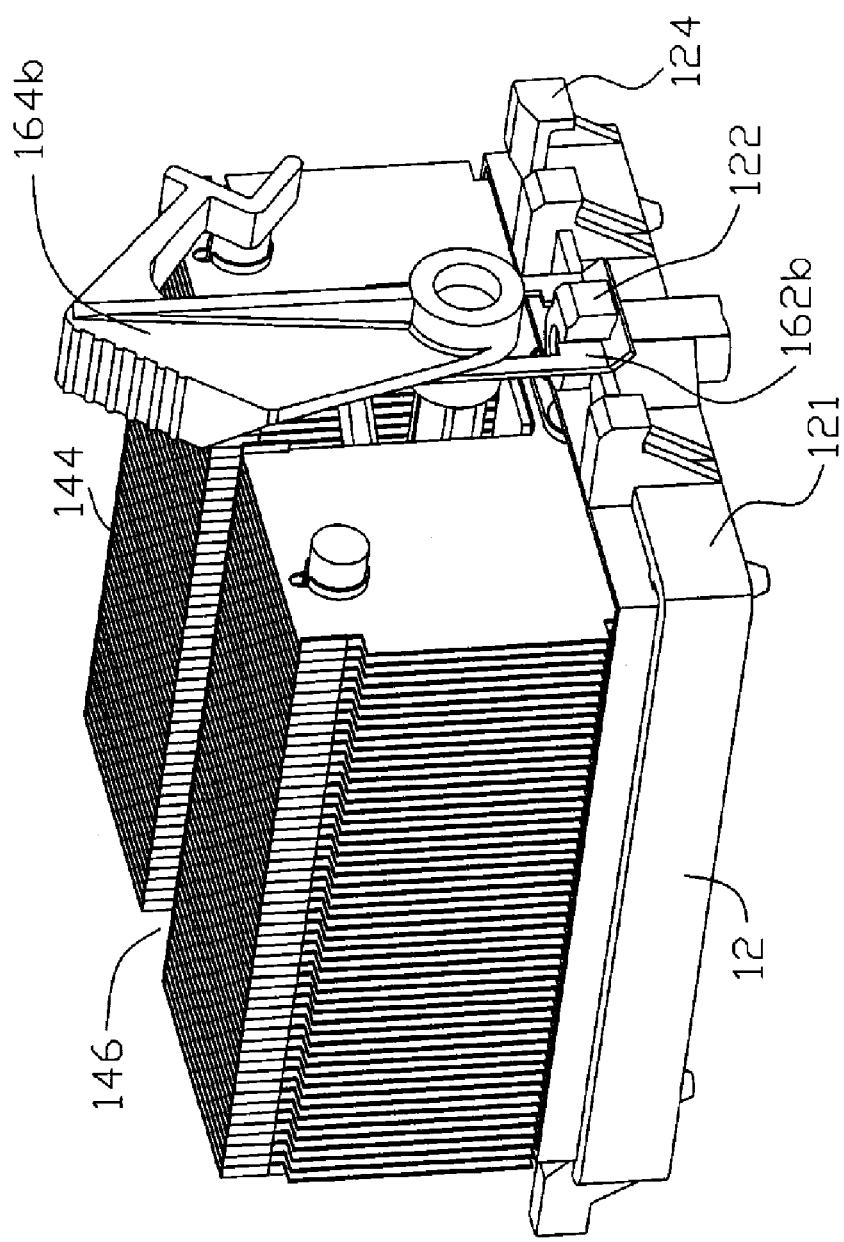
FIG. 3 is an assembled view of FIG. 1 with an operating member at an unlocked position.

Referring to FIGS. 3 and 4, in assembly of the heat dissipating apparatus 10, the heat sink 14 and the clip 16 are respectively mounted to the retention module 12 and the channel 146, with the clipping portions 122 of the retention module 12 extending into the clasping holes 162c, respectively. Meanwhile, two opposite surfaces of the supporting portion 164c of the operating member 164 loosely contacting with the pressing surface 162d of the clipping member 162 and a top surface of the supporting plate, respectively, with the operating member 164 of the clip 16 staying in the unlock position.

Figure 5:
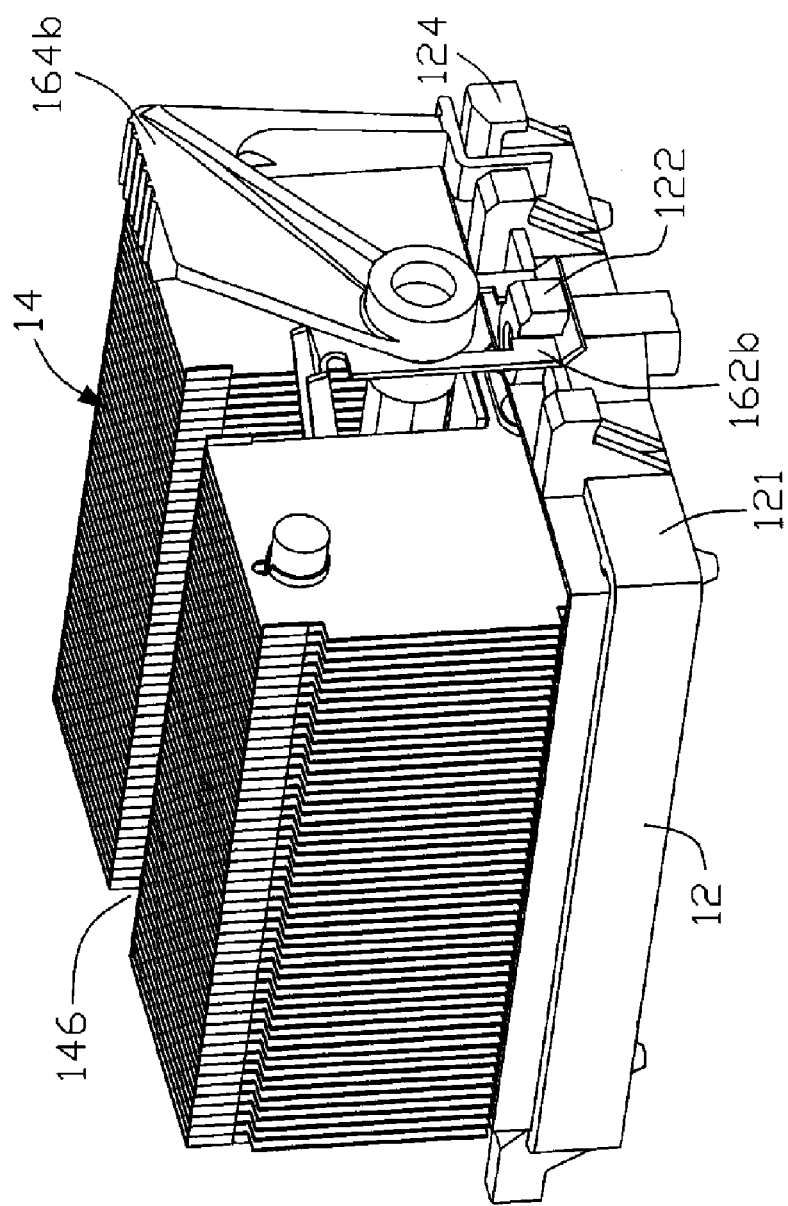
FIG. 5 is an assembled view of FIG. 1 with the operating member at a locked position.
Figure 6:
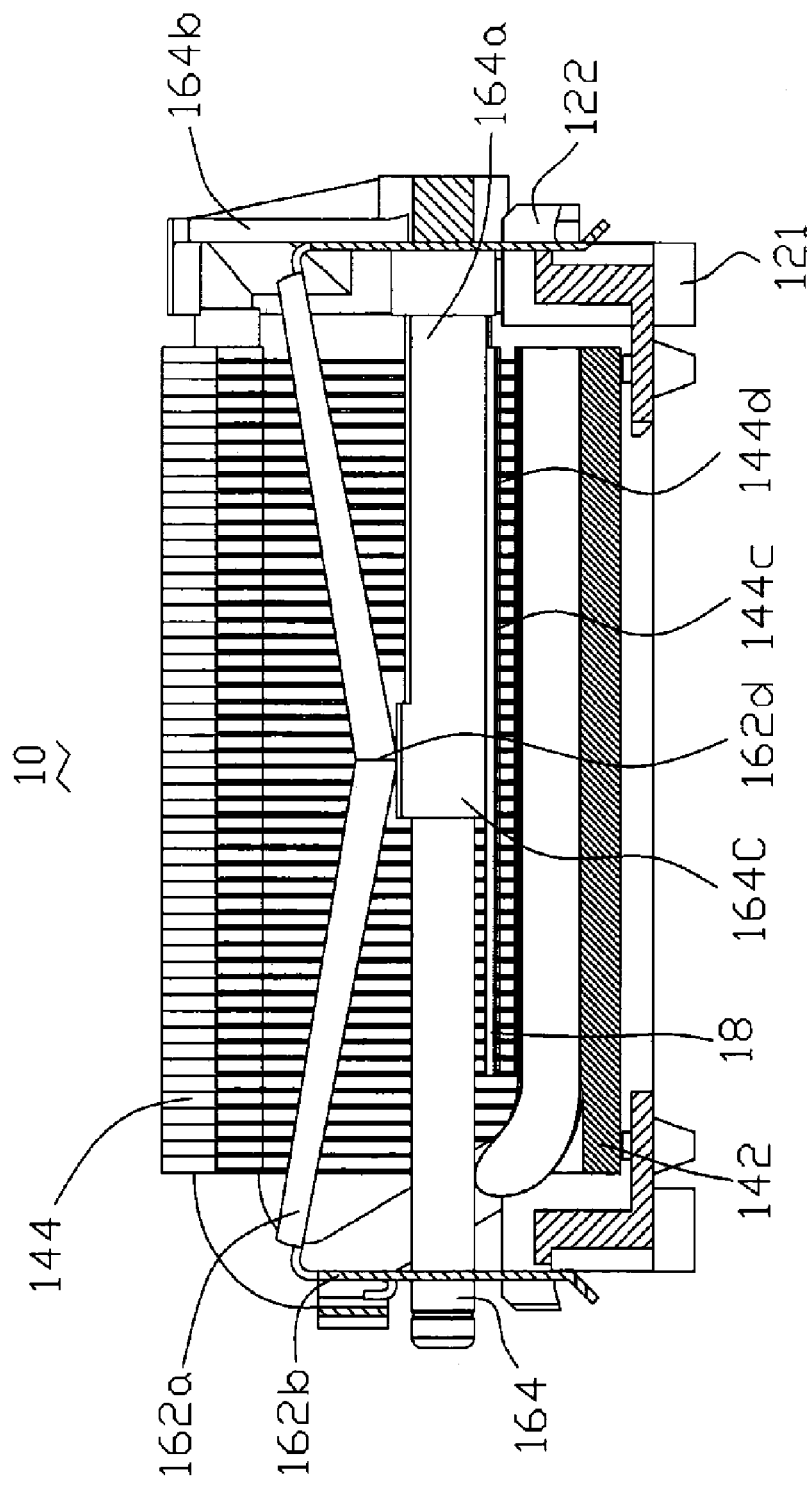
FIG. 6 is an elevational, cross-sectional view of FIG. 5.

Referring to FIGS. 5 and 6, the operating portion 164b of the operating member 164 is pressed to drive the operating member 164 to rotate in the clasping holes 162c of the clipping member 162 until the operating member 164 of the clip 16 reaches the lock position to mount the heat sink 14 on the retention module 12 and downwardly press the heat sink 14 against the heat-generating component so that the heat-generating component intimately engages with the bottom surface of the heat sink 14. In this position, the other two opposite surfaces of the supporting portion 164c respectively abut against the pressing surface 162d and a top surface of the supporting plate 18. The blocking portion 124 of the retention module 12 engages the blocking end 164d of the operating portion 164b, preventing the blocking end 164d from rotating downwardly. In this process, the supporting portion 164c drives the clipping member 162 to move upwardly to reach a position in which the clasping plates 162b securely engage with the clipping portions 122, respectively. So the clipping member 162 exerts a resilient force downwardly on the supporting plate 18 to press the heat sink 14 toward the retention module 12.

In the present invention, the heat sink 14 includes only one fin assembly 144, which simplifies the assembly of the heat dissipating apparatus 10 and further decreases the cost of the heat dissipating apparatus 10. The supporting plate 18 is fixed to supporting surface 144d of the fin assembly 144 and connects the flanges 144c of the fins 144a of the fin assembly 144 together, which strengthens a support of the fin assembly 144 to the clip 16. Furthermore, the supporting plate 18 is capable of distributing the force exerted thereon over a length of the heat sink 14, which prevents the fin assembly 144 from being damaged by the force.

In the assembly of the heat dissipating apparatus 10, the heat sink 14 can be mounted to the retention module 12 just by the rotation of the operating member 164. This makes the heat dissipating apparatus 10 can be simply assembled. The operating member 164 which extends perpendicularly from the longitudinal pole 164a for driving the pole 164a to move from the unlock position to the lock position of the clip 16 is located outside the heat sink 14. Thus, the operation of the clip 16 does not need to occupy a large space of the heat sink 14. The only space the operation of the clip 16 needs to occupy from the heat sink 14 is the channel 146, which is relative small since the pole 164a does not have any significant radial projection thereon and the main body 162a of the clipping member 162 is an elongated plate having a relatively small width.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus configured for dissipating heat from a heat-generating electronic component comprising:
   a heat sink configured for contacting with the heat-generating electronic component, the heat sink comprising a fin assembly which defines a channel therein;
   a resilient clipping member received in the channel of the heat sink, configured for mounting the heat sink on the heat-generating electronic component;
   an operating member pivotally mounted to the clipping member, at least one portion of the operating member mounted between the fin assembly and the clipping member, the at least one portion can move from an unlock position to a lock position to urge the clipping member away from the heat-generating electronic component; and
   a supporting plate sandwiched between the at least one portion of the operating member and the fins of the fin assembly for evenly distributing a force exerted thereon over the heat sink;
   wherein each of the fins comprises a flange, the flanges of the fins of the fin assembly form a supporting surface, the supporting plate is mounted on the supporting surface of the fin assembly.

2. The heat dissipating apparatus as described in claim 1, wherein the supporting plate is fixed to the fin assembly via solder paste filled in spaces formed between a bottom surface of the supporting plate and the supporting surface.

3. The heat dissipating apparatus as described in claim 1, further comprising a retention module disposed around the heat-generating electronic component, two ends of the clipping member are attached to the retention module.

4. The heat dissipating apparatus as described in claim 3, wherein the retention module comprises two clipping portions, the clipping member defines two clasping holes at the ends thereof for receiving the clipping portions therein.

5. The heat dissipating apparatus as described in claim 3, wherein the retention module comprises a blocking portion, the operating member comprises a blocking end at an end thereof for engaging with the blocking portion when the operating member is rotated to the lock position.

6. The heat dissipating apparatus as described in claim 3, wherein the at least one portion is one of cam-shaped configuration and ellipse-shaped configuration.

7. A heat dissipating apparatus comprising:
   a retention module configured for disposing around a heat generating electronic component;
   a heat sink mounted to the retention module and configured for contacting with the heat generating electronic component, the heat sink comprising a plurality of spaced fins and defining a channel therein;
   a clip disposed in the channel of the heat sink for mounting the heat sink to the retention module; and
   a planar supporting plate received in the channel and sandwiched between the clip and top surfaces of the fins of the heat sink and longitudinally extending from one end of the channel towards an opposite end thereof for distributing a force exerted thereon over the heat sink.

8. The heat dissipating apparatus as described in claim 7, wherein the heat sink comprises a fin assembly, the channel is defined in the fin assembly.

9. The heat dissipating apparatus as described in claim 7, wherein the clip comprises a resilient clipping member, the clipping member is attached to the retention module to sandwich the heat sink between retention module and the clip.

10. The heat dissipating apparatus as described in claim 9, wherein the clip further comprises an operating member sandwiched between the clipping member and the supporting plate, the operating member is capable of rotating from an unlock position to a lock position to mount the heat sink to the retention module.

11. The heat dissipating apparatus as described in claim 9, wherein the retention module comprises clipping portions extending therefrom, the clipping member defines two clasping holes at the two ends thereof to receive the clipping portions of the retention module therein.

12. The heat dissipating apparatus as described in claim 11, wherein the operating member comprises a longitudinal pole pivotably received in the clasping holes of the clipping member, the pole comprises a supporting portion which enables to drive the clipping member to move away the supporting plate.

13. The heat dissipating apparatus as described in claim 12, wherein the supporting portion is cam-shaped or ellipse-shaped.

14. A heat dissipating apparatus comprising:
   a fin assembly comprising a plurality of fins connected together, each fin having a cutout at a middle thereof, two halves beside the cutout and a bridge integrally interconnecting the two halves of the fin together, the cutouts cooperatively forming a channel for the fin assembly;
   a clipping member having an elongate main body received in the channel of the fin assembly and two clasping members extending downwardly from two ends of the main body, respectively;
   an operating member having a pole received in the channel, extending through the clasping members of the clipping member and rotatable therein between a first position and a second position, the pole being sandwiched between the main body of the clipping member and the fin assembly, during rotation from the first to the second position, the pole urging the main body of the clipping member to move in a direction away from the fin assembly; and
   a supporting plate received in the channel and sandwiched between the pole of the operating member and the fin assembly;
   wherein the pole has a cam-shaped supporting portion urging the main body of the clipping member to move away from the fin assembly when the pole is rotated from the first position to the second position; and
   wherein the main body of the clipping member is bent downwardly at a middle portion thereof, the middle portion forming a pressing surface of the main body, the supporting portion of the pole urging the pressing surface to move away from the fin assembly when the pole is rotated from the first position to the second position.

15. The heat dissipating apparatus as described in claim 14 wherein the supporting plate is soldered to the fin assembly.

* * * * *